(12) United States Patent
Waldrip et al.

(10) Patent No.: US 7,394,293 B1
(45) Date of Patent: Jul. 1, 2008

(54) CIRCUIT AND METHOD FOR RAPID POWER UP OF A DIFFERENTIAL OUTPUT DRIVER

(75) Inventors: Jeffrey Waldrip, Austin, TX (US);
Stephen M. Prather, Austin, TX (US);
Matthew Berzins, Austin, TX (US);
Charles Cornell, Austin, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 289 days.

(21) Appl. No.: 11/286,764

(22) Filed: Nov. 23, 2005

Related U.S. Application Data

(63) Continuation of application No. 11/123,469, filed on May 5, 2005, now abandoned, which is a continuation of application No. 10/949,636, filed on Sep. 24, 2004, now abandoned.

(60) Provisional application No. 60/506,389, filed on Sep. 25, 2003.

(51) Int. Cl.
*H03K 19/0175* (2006.01)
(52) U.S. Cl. .............................. 326/83; 326/81; 326/68
(58) Field of Classification Search .................. 326/68, 326/81–86
See application file for complete search history.

(56) References Cited

U.S. PATENT DOCUMENTS

| | | | |
|---|---|---|---|
| 4,638,187 A | 1/1987 | Boler et al. | |
| 4,877,978 A | 10/1989 | Platt | |
| 4,885,485 A | 12/1989 | Leake et al. | |
| 4,978,905 A | 12/1990 | Hoff et al. | |
| 5,362,997 A | 11/1994 | Bloker | |
| 5,383,157 A | 1/1995 | Phelan | |
| 5,424,657 A * | 6/1995 | Van Brunt et al. | 326/63 |
| 5,534,806 A | 7/1996 | Gowni et al. | |
| 5,559,447 A | 9/1996 | Rees | |
| 5,568,081 A | 10/1996 | Lui et al. | |
| 5,570,043 A | 10/1996 | Churchill | |
| 5,600,261 A | 2/1997 | White et al. | |
| 5,636,161 A | 6/1997 | Mann | |
| 5,721,508 A | 2/1998 | Rees | |
| 5,768,196 A | 6/1998 | Bloker | |
| 5,828,262 A | 10/1998 | Rees | |
| 5,856,753 A | 1/1999 | Xu et al. | |
| 5,864,509 A | 1/1999 | Anumula | |
| 5,898,315 A | 4/1999 | Knaack | |
| 5,914,844 A | 6/1999 | Lutley et al. | |
| 5,917,335 A | 6/1999 | Rees | |
| 5,986,489 A | 11/1999 | Raza et al. | |
| 6,218,823 B1 * | 4/2001 | Keeth | 323/313 |
| 6,225,819 B1 | 5/2001 | Rees et al. | |
| 6,237,107 B1 | 5/2001 | Williams et al. | |
| 6,249,466 B1 | 6/2001 | Ramakrishnan | |
| 6,323,701 B1 | 11/2001 | Gradinariu et al. | |
| 6,329,840 B1 | 12/2001 | Moyal | |
| 6,378,008 B1 | 4/2002 | Gradinariu | |

(Continued)

*Primary Examiner*—Don Le

(57) ABSTRACT

Output driver circuits and related methods. In one example, the output driver circuit includes a translator for converting the single ended data input signal into a pair of signals; a set of output transistors selectively controlled by the pair of signals; a cascode current source for providing a substantially constant current to the set of output transistors when the output transistors are active; and a dump path in parallel with the set of output transistors. A circuit portion for pre-charging the pair of signals to a pre-charged voltage between VCC and ground may also be provided.

20 Claims, 4 Drawing Sheets

U.S. PATENT DOCUMENTS

| | | |
|---|---|---|
| 6,380,762 B1 | 4/2002 | Pancholy et al. |
| 6,469,548 B1 | 10/2002 | Huang et al. |
| 6,529,036 B1 | 3/2003 | Rai |
| 6,538,485 B1 | 3/2003 | Churchill |
| 6,556,048 B1 | 4/2003 | Dunne |
| 6,580,291 B1 | 6/2003 | Lutley |
| 6,593,769 B1 | 7/2003 | Rai |
| 6,970,032 B1 | 11/2005 | Smith et al. |

* cited by examiner

US 7,394,293 B1

CIRCUIT AND METHOD FOR RAPID POWER UP OF A DIFFERENTIAL OUTPUT DRIVER

CROSS REFERENCE TO RELATED APPLICATION

This application is a continuation of U.S. patent application Ser. No. 11/123,469, filed May 5, 2005, entitled "CIRCUIT AND METHOD FOR RAPID POWER UP OF A DIFFERENTIAL OUTPUT DRIVER", now abandoned; which is a continuation of U.S. patent application Ser. No. 10/949,636 filed Sep. 24, 2004, entitled "CIRCUIT AND METHOD FOR RAPID POWER UP OF A DIFFERENTIAL OUTPUT DRIVER", now abandoned, which claims the priority under 35 U.S.C. 119(e) to U.S. provisional application No. 60/506,389 entitled "METHOD FOR RAPID POWER UP OF A DIFFERENTIAL OUTPUT DRIVER" filed Sep. 25, 2003, the disclosures of which are hereby incorporated by reference in their entirety.

TECHNICAL FIELD

The present invention relates generally to electronic circuits, and in particular to output driver circuits.

BACKGROUND OF THE INVENTION

Output driver circuits are used to transmit signals out of an integrated circuit device. Differential output drivers are typically used to transmit serial data at high speeds with low voltage signal swings. For example, the data bus of the Universal Serial Bus (USB) uses differential signals to communicate data between USB devices. Per the USB 2.0 specification, high speed output drivers that desire to write data to the USB bus must provide 18 milliamps of current on the properly terminated data bus lines D+ and D−.

In such an arrangement, one issue relates to power management of the output driver of an integrated circuit adapted to communicate over the USB bus. A first conventional solution uses a P-type field effect transistor (PFET) switch in series with a current source to enable and disable an output. However, when the output-enable switch turns on, coupling through the large gate-drain capacitance of the current source disrupts the current source bias voltage. An alternate approach comprises a "dump" PFET in parallel with the output-enabled PFET. When the output is disabled, the current source is shorted to ground, wasting power. A disadvantage of the first conventional solution is that it always burns the current source power, even when not transmitting.

In another solution, shown in FIG. 1, a device comprises a plurality of blocks each dumping current. The current dumping occurs only briefly before and after a transmit operation. In this approach, when the dump path is enabled before a transmit operation, coupling through the large current source gate-drain capacitance significantly disrupts the PBIAS node. A correction amplifier senses the bias change, and sinks/sources current in response. A disadvantage of this approach is that it requires the design of the bias correction amplifier which consumes static current constantly.

As recognized by the present inventors, what is needed is an improved output driver that consumes a reduced amount of current, which would be useful various application including battery powered applications such as mobile computing or for bus-powered USB applications.

It is against this background that embodiments of the present invention have been developed.

SUMMARY

According to one broad aspect of one embodiment of the present invention, disclosed herein is an output driver circuit. In one example, the output driver circuit includes a translator for converting the single ended data input signal into a pair of signals; a set of output transistors selectively controlled by the pair of signals; a current source for providing a substantially constant current to the set of output transistors when the output transistors are active; and a dump path in parallel with the set of output transistors.

In one embodiment, logic for selectively controlling the set of output transistors and the dump path is provided. The logic may include a current enable signal for controlling current flow and a output enable signal for controlling the set of output transistors, wherein about a time when the current enable signal is active and the output enable signal is not active, the dump path is activated so that current from the current source flows through the dump path. In another example, the logic may include a current enable signal for controlling current flow and a output enable signal for controlling the set of output transistors, wherein about a time when the current enable signal is active and the output enable signal is active, the dump path is deactivated so that current from the current source does not flow through the dump path.

In one example, the current source may provide approximately 17-19 milliamps (e.g., 18 milliamps) of current, and in another example, the current source is a cascode current source. A voltage reference circuit may provide a substantially constant voltage to the current source.

The output driver circuit may also include a circuit for pre-charging the pair of signals to a pre-charged voltage between VCC and ground. In one example, the pre-charged voltage is approximately 800 millivolts.

In one example, at least one flip flop may be connected between the data input and the translator, and in another example, at least one flip flop may be connected between the output enable signal and the dump path.

In one embodiment, the dump path may include a p-channel transistor having its gate coupled with a current enable signal and an output enable signal through one or more logic gates, the p-channel transistor having its drain coupled with ground through a resistor.

According to another broad aspect of another embodiment of the present invention, disclosed herein is a method for operating a differential output driver. In one example, the method includes the operations of biasing a current source so that the current source is able to provide a substantially constant current; providing a dump path to ground, the dump path being normally open-circuited so that no current flows through the dump path; providing a set of output transistors in parallel with the dump path, the set of transistors being normally open-circuited so that no current flows through the set of output transistors; activating the dump path so that current from the current source flows through the dump path; pre-charging a set of data pre-buffer signals to a voltage level; deactivating the dump path so that no current flows through the dump path; and activating the set of output transistors so that current flows through the set of output transistors and data is transmitted by the output transistors.

In one example, the current source is biased to provide approximately 17-19 milliamps. The operation of pre-charging may place the set of data signals to approximately 700-900 (e.g., 800) millivolts.

According to another broad aspect of another embodiment of the present invention, disclosed herein is an output driver circuit including a translator for converting the single ended data input signal into a pair of signals; a set of output transistors selectively controlled by the pair of signals; a current source for providing a substantially constant current to the set of output transistors when the output transistors are active; and a circuit for pre-charging the pair of pre-buffer signals to a pre-charged voltage between VCC and ground. The output driver circuit may also include a dump path in parallel with the set of output transistors. The translator includes two or more transistors configured as a differential amplifier, and the current source may be a cascode current source. In one example, the pre-charged voltage is approximately 700-900 millivolts.

The features, utilities and advantages of the various embodiments of the invention will be apparent from the following more particular description of embodiments of the invention as illustrated in the accompanying drawings.

DETAILED DESCRIPTION

Disclosed herein are embodiments of an improved circuit and method for rapid power up and efficient power control of a differential output driver. Various embodiments of the present invention are described herein.

Figure 2:
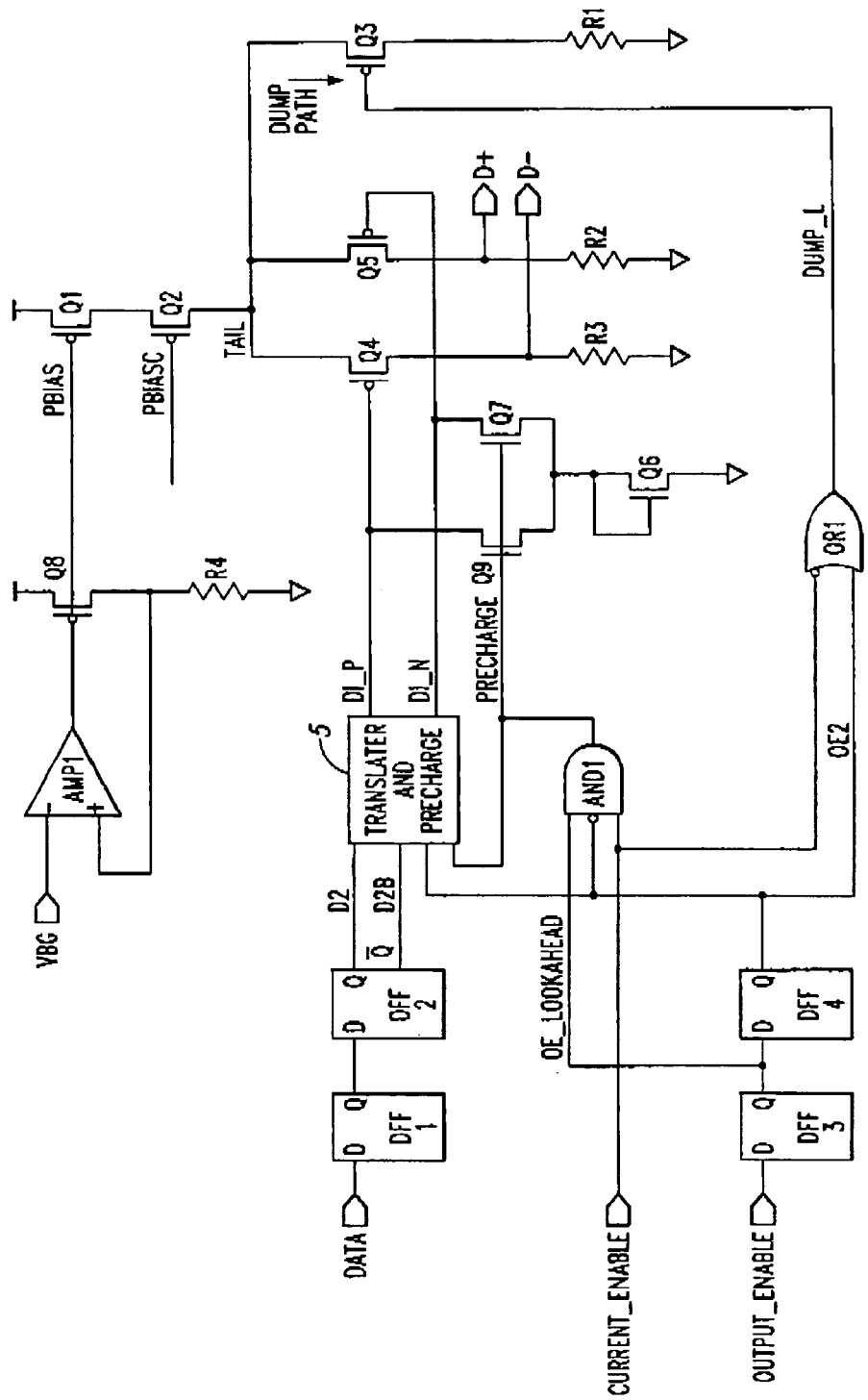
FIG. 2 illustrates an example of a circuit for driving a differential signal, shown as D+ and D−, in accordance with one embodiment of the present invention.
Figure 3:
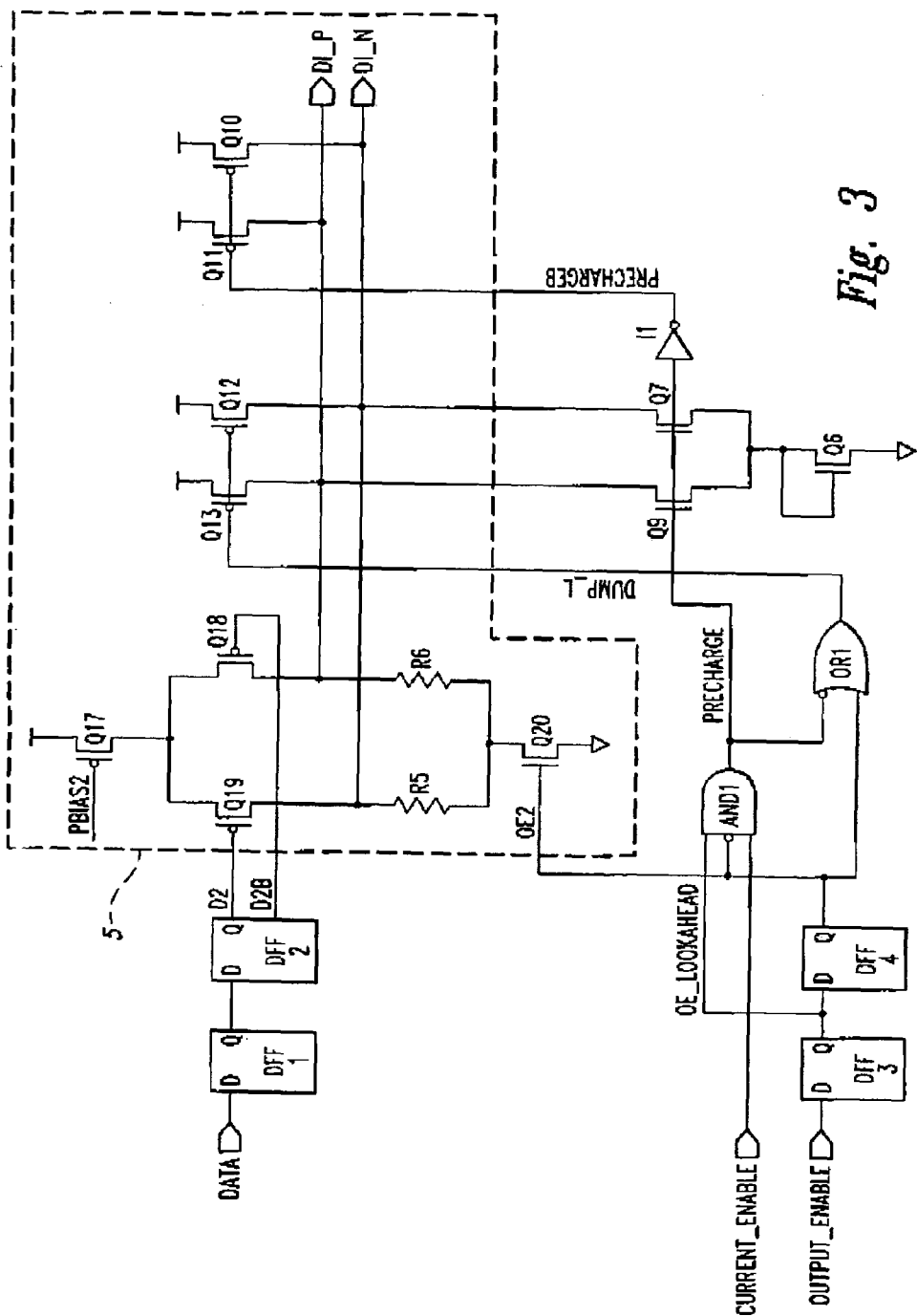
FIG. 3 illustrates an example of a translator/pre-charge circuit used in FIG. 2, in accordance with one embodiment of the present invention.
Figure 4:
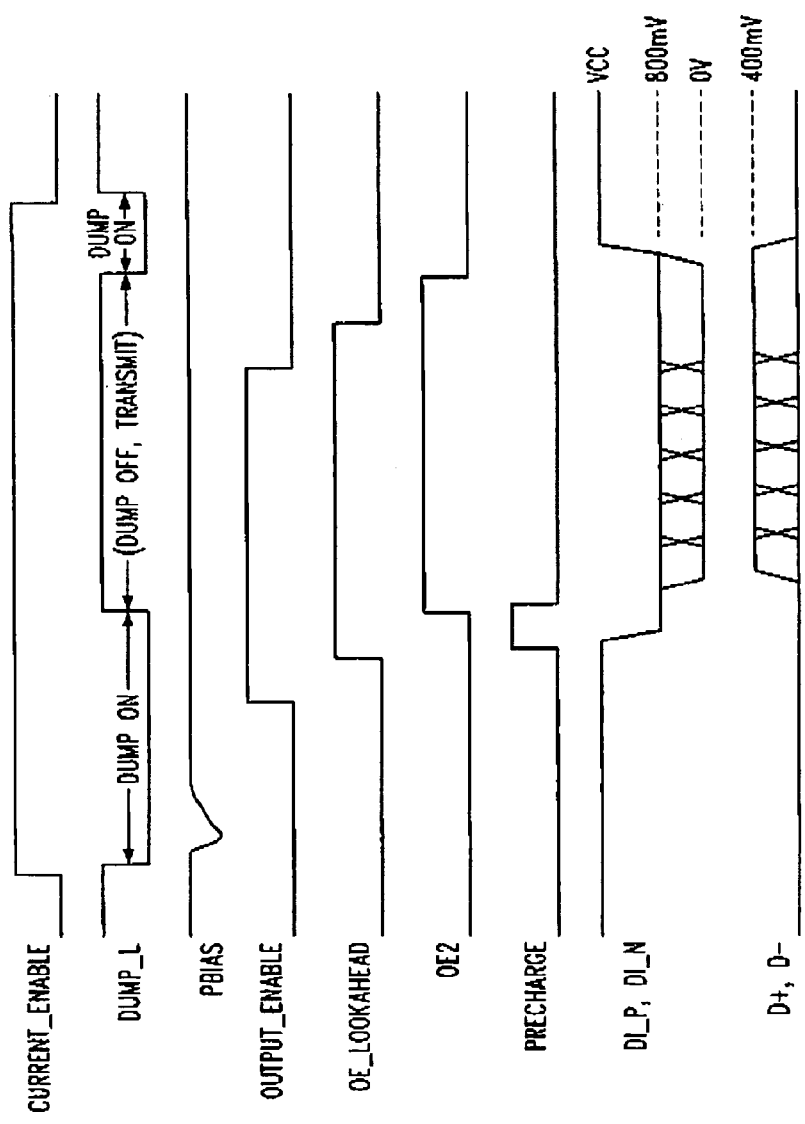
FIG. 4 is a timing diagram of the circuits of FIGS. 2-3, in accordance with one embodiment of the present invention.

FIGS. 2 and 3 illustrate an example of a circuit implementation of an embodiment of the present invention, and FIG. 4 illustrates an example of a timing diagram for this circuit implementation. It is understood that the present invention may be implemented in a variety of different circuit implementations, and that the examples of FIGS. 2-4 are provided by way of example only.

Figure 1:
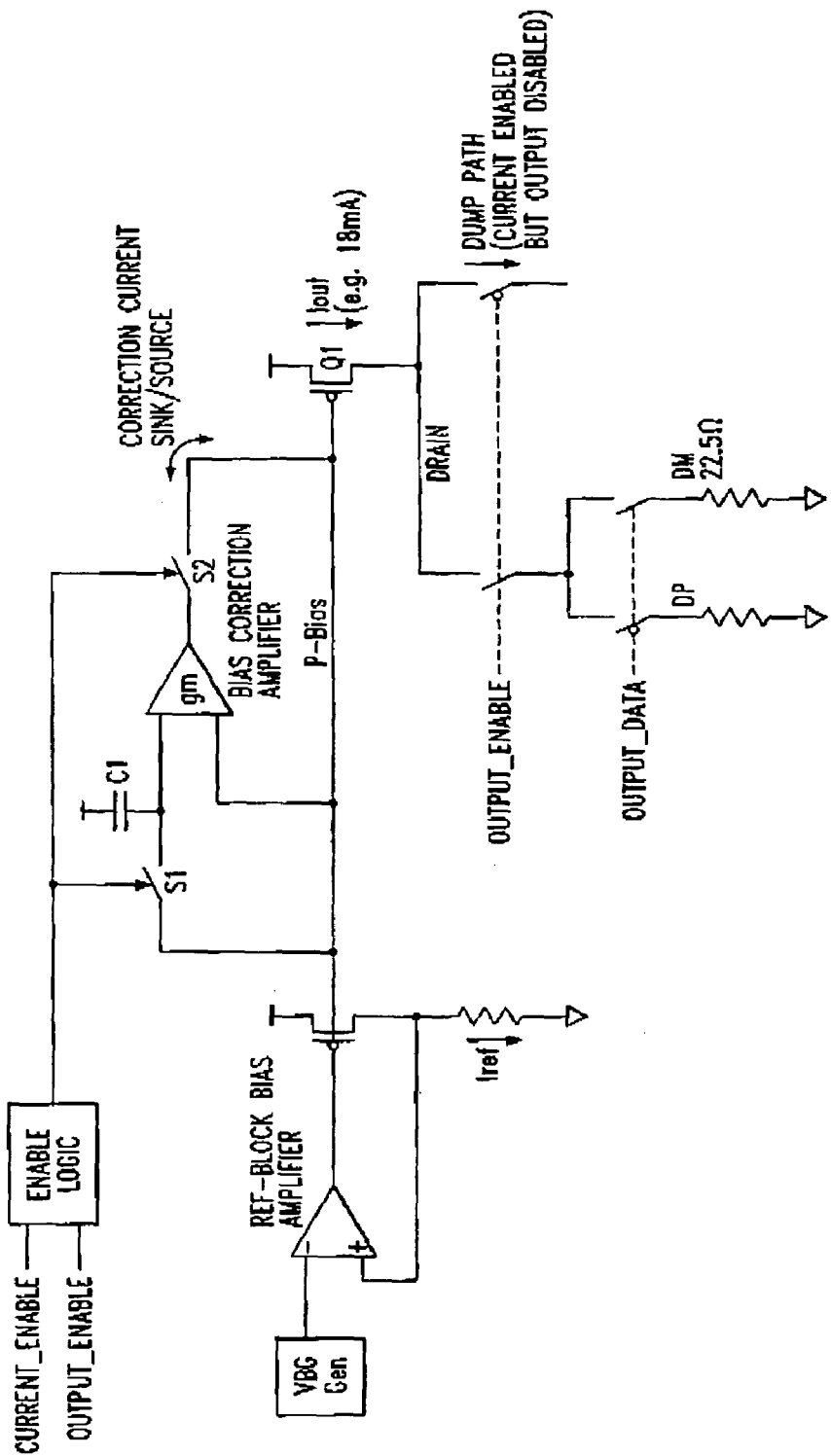
FIG. 1 illustrates an example of a differential output driver.

The improved circuit of FIGS. 2-3 eliminates a series OUTPUT_ENABLE PFET switch shown and described in the approach of FIG. 1. This results in improved headroom, enabling the current source to be cascoded. The cascoded current source allows for shorter length (L) of the Ml transistor, which means lower width (W) and lower gate-to-drain (Cgd) capacitance. Due to the lower Cgd capacitance on the current source FET, the disruption resulting from turning the dump path on/off is decreased. Further, the circuit of FIGS. 2-3 does not require an extra bias correction amplifier as used in FIG. 1.

Referring to FIG. 2, the circuit receives a data input signal DATA and provides differential data outputs D+ and D− that may be used to drive a data bus, such as a USB data bus. The circuit also includes various logic signals for controlling the states of the circuit. In one example, the circuit has at least two operational states, a first state where data is not being transmitted and output current flow is disabled (a low power mode), and a second state where data is being transmitted and output current is enabled (an active transmitting state). The circuit of FIG. 2 includes a path for controllably dumping current before and after data transmissions, and in one example the dump path is in parallel with the output transistors Q4, Q5.

Transistors Q1 and Q2 form a cascoded current source that are driven by bias signals provided by AMP1, transistor Q8, and resistor R4. In one example, the cascoded current source formed by transistors Q1, Q2 provides a current of any desired value. In one application, the current source may provide approximately 17-19 milliamps, at 18 milliamps to be compliant with USB 2.0.

As used herein, the term "transistor" or "switch" includes any switching element which can include, for example, n-channel or p-channel CMOS transistors, MOSFETs, FETs, JFETS, BJTS, or other like switching element or device. The particular type of switching element used is a matter of choice depending on the particular application of the circuit, and may be based on factors such as power consumption limits, response time, noise immunity, fabrication considerations, etc. Hence while embodiments of the present invention are described in terms of p-channel and n-channel transistors, it is understood that other switching devices can be used, or that the invention may be implemented using the complementary transistor types.

P-channel transistor Q1 has its source coupled with the supply, and its drain coupled with the source of P-channel transistor Q2. The gate of transistor Q1 is coupled with the PBIAS signal. In one example, the PBIAS signal is provided by a transistor Q8, an amplifier AMP1 and a resistor R4. The P-channel transistor Q8 has its source coupled with the supply, its gate driven by the output of amplifier AMP1, and the drain of transistor Q8 is coupled with ground through resistor R4 and is also coupled with the non-inverting input of AMP1. A reference signal VBG, such as a constant voltage such as a conventional bandgap reference voltage, may be supplied to the other input of AMP1. The PBIAS signal can be drawn from the gate of transistor Q8. The PBIAS and PBIASC signals can be supplied by any conventional cascode bias voltage arrangement.

The drain of transistor Q2 is coupled with the sources of P-channel transistors Q3, Q4, and Q5, in one example. The sources of transistors Q3, Q4, Q5, are coupled together and coupled with the output of the cascoded current source at a node labeled TAIL in FIG. 2. P-channel transistor Q3 has its gate coupled with the output of an OR logic gate OR1, and has its drain coupled with ground through resistor R1. Transistor Q3 and resistor R1 coupled to ground form a controllable path to ground which can be used to dump current to ground.

Translator 5 receives a DATA signal on its input, along with an OUTPUT_ENABLE control signal and a PRECHARGE control signal. Translator 5 converts the DATA signal to a differential signal shown as DI_P and DI_N which are coupled with the gates of transistors Q4, Q5 in one example. As will be explained below and shown in FIG. 3, translator 5 also includes precharge circuitry to controllably alter the voltage on the signals DI_P and DI_N.

In FIG. 2, p-channel transistor Q4 has its gate coupled with the DI_P output of translator 5 and the drain of transistor Q4 is coupled with ground through resistor R3. P-channel transistor Q5 has its gate coupled with the DI_N output of translator 5, and the drain of transistor Q5 is coupled to ground through resistor R2. In one example, the USB data signals D+ and D− may be taken from the drains of transistors Q5, Q4.

The DATA signal and logic control signals CURRENT_ENABLE and OUTPUT_ENABLE may be clocked through one or more flip flops. In FIG. 2, CMOS data is clocked through a flip flop DFF1 in series with a flip flop DFF2 whose output is coupled with the input of translator 5. These flip flops DFF1 and DFF 2 are provided to remove distortions that may be present in the DATA signal and to delay the DATA signal by one clock period to give the OE_LOOKAHEAD signal enough time to perform its operations. In one example, DFF2 has a pair of outputs including a non-inverted output and an inverted output (see FIG. 3, where the outputs of DFF2 are labeled D2 and D2B).

In FIG. 2. as to the outputs of translator 5, the DI_P signal is coupled with the drain of N-channel transistor Q9, and the DI_N signal is coupled with the drain of N-channel transistor Q7. The sources of transistors Q9 and Q7 are coupled with the drain and gate of N-channel transistor Q6, which has its source coupled with ground. The gate of transistors Q9 and Q7 are coupled with the PRECHARGE signal.

The OUTPUT_ENABLE control signal may be connected with a flip flop DFF3 whose output shown as "OE_LOOKAHEAD" may be connected with a non-inverting input of an AND gate AND1. The output of flip flop DFF3 may be coupled with another flip flop DFF4 whose output, shown as "OE2," can be coupled into a non-inverting input of an OR gate OR1, an inverted input of an AND gate AND1, and into translator 5.

The CURRENT_ENABLE signal can be input into a non-inverting input of AND gate AND1, and an inverting input of OR gate OR1. The output of gate AND1 forms the PRECHARGE signal which, in one example, may be fed into translator 5 and may also drive the gates of transistors Q7 and Q9. The output of OR gate OR1, shown as "DUMP_L" can be coupled with and drive the base of transistor Q3 in order to control the activation/deactivation of the dump path, in one example.

The state of the signals CURRENT_ENABLE and OUTPUT_ENABLE can be controlled by logic (not shown) that cycles these signals, for instance in a manner as described herein and as shown in the timing diagram of FIG. 4.

Referring to FIG. 3, one example of translator 5 (of FIG. 2) is illustrated in greater detail. In this example, translator 5 can include P-channel transistor Q17 with its source coupled with supply, its gate coupled with a bias signal PBIAS2 which may be provided by any conventional current mirror or bias circuit, and its drain coupled with the sources of P-channel transistors Q18, Q19. Transistor Q18 has its gate coupled with one of the outputs of flip flop DFF2 (e.g., the D2B signal) and transistor Q19 has its gate coupled with the other output of flip flop DFF2 (e.g., the D2 signal).

The drain of transistor Q18 is coupled with the drain of transistor Q20 through resistor R6. The drain of transistor Q19 is coupled with the drain of transistor Q20 through resistor R5. N-channel transistor Q20 has its source coupled with ground, and its gate coupled with the OE2 signal which is coupled with the output of flip flop DFF4.

P-channel transistors Q12 and Q13 each have their source coupled with supply, and their gates coupled with the output of OR gate OR1 (e.g., the DUMP_L signal). The drain of transistor Q12 is coupled with the drain of N-channel transistor Q7 (FIG. 2). The drain of transistor Q13 is coupled with the drain of N-channel transistor Q9 (FIG. 3).

P-channel transistors Q10 and Q11 each have their sources coupled with supply and their gates coupled with the signal PRECHARGEB, an inverted version of the PRECHARGE signal, through an inverter I1. The drain of transistor Q11 is coupled with the drain of transistor Q13 and the drain of transistor Q18 and the drain of transistor Q9 to provide the DI_P signal. The drain of transistor Q10 is coupled with the drain of transistor Q12 which is coupled with the drain of transistor Q19 and resistor R5 to provide the signal DI_N.

In one example, the signals DI_P and DI_N are pre-charged one bit time before transmit. This pre-charge step prevents the first transmitted bit from being corrupted and failing the eye diagram of USB or other standards. The voltage swing for the pre-charge shown in FIGS. 2-3 is approximately equal to an NFET threshold voltage. This allows the pre-charge step to use a diode connected NFET (transistor Q6) to set the voltage level. After the pre-charge step, normal data transmission begins with the DI_P and DI_N lines switching differentially.

In FIG. 2, translator/pre-buffer circuit 5 generates the DI_P and DI_N signals that drive the output amplifier (Q4 & Q5). In FIG. 3, transistors Q17, Q18, Q19 convert the CMOS signals D2 and D2B from flip flop DFF2 into low swing differential signals during transmit. Transistor Q20 disables this section when the output is disabled and when pre-charge is occurring. When the output is disabled (but not during pre-charge), transistors Q12, Q13 hold the DI_P and DI_N signals at VCC.

Transistors Q10, Q11 are weak pull-up devices which prevent the DI_P and DI_N signals from drifting too low due to subthreshold leakage from Q6. Transistors' Q10, Q11 strength can also be varied to adjust the voltage level during pre-charge.

In operation, there are at least two modes implemented by the example circuit of FIGS. 2-3. In one example, the circuit has a first state or mode where data is not being transmitted and output current flow is disabled (a low power mode), and a second state where data is being transmitted and output current is enabled (an active transmitting state).

The timing diagram in FIG. 4 shows the power-up sequence, data transmission, and power-down for the circuit of FIGS. 2-3. In particular, the timing diagram shows various states/processes, including a 1) state of current disabled (e.g., CURRENT_ENABLE is low); 2) a state of current enabled (e.g., CURRENT_ENABLE is high), dumping activated, PBIAS recovery; 3) a state of current enabled, dumping activated, precharging of signals DI_P and DI_N; 4) a state of current enabled, dumping deactivated, data transmitting; and 5) a state of current enabled, dumping activated to enable a clean final bit of the data transmission. Then the process is returned to the first state, in one example.

In the low power state and referring to FIG. 4, the CURRENT_ENABLE signal is inactive (e.g., low); the DUMP_L signal is inactive (e.g., high, which maintains transistor Q3 off and the dump path non-conducting), and the OUTPUT_ENABLE signal is inactive (e.g., low). The outputs DI_P and DI_N of translator 5 are at VCC, which maintain output transistors Q4 and Q5 off.

In the mode for transmitting data, the CURRENT_ENABLE control signal is set to active (e.g., high). Assuming that OUTPUT_ENABLE is low when CURRENT_ENABLE is asserted as shown in FIG. 4, then in FIG. 2 through the logic gate OR1 the DUMP_L signal goes low which turns on transistor Q3 so current flows (e.g., 18 milliamps) through the dump path through transistor Q3 and resistor R1.

Even before CURRENT_ENABLE went active, AMP1 and transistor Q8 were active and are providing the bias voltage to the cascode current source Q1, Q2 so that Q1, Q2 are biased to provide the 18 milliamps of current (no current flowed, however, until either Q3, Q4 or Q5 are turned on).

When the 18 milliamps starts to flow through transistor Q3, it causes a perturbation on the TAIL node of FIG. 2 and that causes a perturbation on the bias voltages PBIAS and PBIASC of the current source (the disruption in PBIAS is shown in FIG. 4). So AMP1 needs time to drive bias voltages PBAIS and PBIASC back to their proper values.

In FIG. 4, there is a period of time where DUMP_L is low, which is provided to wait for the current source to come back to its correct value. The signal OUTPUT_ENABLE is still inactive (e.g., low) which keeps transistor Q20 off and keeps the signals DI_P and DI_N at VCC by transistors Q12, Q13.

During this time, the OUTPUT_ENABLE signal may be set high. In FIG. 2, when OUTPUT_ENABLE goes high, after OUTPUT_ENABLE gets clocked into the circuit the signal OE_LOOKAHEAD goes active (e.g., high) through flip flop DFF3. When OE_LOOKAHEAD goes active, that causes the PRECHARGE signal to start going active (e.g., high) and transistors Q12, Q13 turn off via DUMP_L.

But because the signal OE2 retains the state of the OUTPUT_ENABLE signal for two cycles due to the two flip flops DFF 3, DFF4, the signal OE2 remains low until the output of flip flop DFF4 goes high and turns on Q20.

While OE2 is low (so that Q20 is off), signals DI_P and DI_N in FIG. 3 and FIG. 2 are at VCC. The precharge transistors Q7, Q9 turn on in response to the PREHCHARGE signal and the signals DI_P and DI_N begin to pull down from their VCC values which they are normally kept at. The reason the signals DI_P and DI_N are normally kept at VCC is to keep output transistors Q4 and Q5 turned off during a non-transmit state.

While the circuit is dumping current through transistor Q3 and now that the PBIAS signal is steady to provide a solid 18 milliamps current source, the DI_P and DI_N signals can be prepared by setting them to a ready state (e.g., both signals sitting at 800 millivolts). This can be preformed by the OE_LOOKAHEAD signal.

When the OUTPUT_ENABLE signal goes active, after two bits times flip flop DFF4 clocks the OUTPUT ENABLE signal on flip flop DFF3 to set OE2 active (e.g., high). In FIG. 3, when OE2 turns on, it turns on transistor Q20, then transistors Q19 and Q18 form a differential pair driven by signals D2 and D2B from flip flop DFF2. This starts the signals DI_P and DI_N to start swinging their 0-800 millivolt levels. Initially, the signals DI_P and DI_N were both charged to 800 millivolts, but when Q20 is enabled with OE2, then the signals DI_P and DI_N start to become the differential output of a differential amplifier. At that time, in FIG. 4 when OE2 goes high, the dump path (e.g., transistor Q3) is turned off through logic gate OR1.

Hence, when signal OE2 goes active and turns on the differential amplifier in the translator 5, at the same time, OE2 turns off the dump current through transistor Q3 so that the 18 milliamps (which is a now a steady current) starts dumping across transistors Q4 and Q5 in FIG. 2. The 800 milliamps of current will go through either Q4 or Q5 because now signals DI_P and DI_N are starting to be differential instead of both just pulled down to 800 millivolts or VC.

As DI_P and DI_P differentially swing between 0 and 800 millivolts, these signals provide the proper gate voltage to transistors Q4 and Q5 to turn on and off in such a way that the output signals D+ and D− swing from 0 to 400 millivolts back and forth, depending on the data being transmitted as shown in FIG. 4.

Once the data stream being transmitted is complete, the OUTPUT_ENABLE signal is disabled (e.g., set low), which propagates through flip flop DFF3 to turn off OE_LOOKAHEAD and through flip flop DFF4 to turn off (e.g., low) OE2. This turns off translator 5 by OE2 turning off transistor Q20.

Also, when OE2 goes inactive then transistors Q13 and Q12 turn on which pulls signals DI_P and DI_N high. When those two signals DI_P and DI_N go high, in FIG. 2 output transistors Q4 and Q5 turn off.

In FIG. 4, when the signal OE2 goes low, then the signal DUMP_L goes active and the dump path turns on. In FIG. 2, transistors Q4 and Q5 turn off and transistor Q3 turns on. So at the end of a packet transmission, the output transistors Q4, Q5 are turned off and the dump path through transistor Q3 is turned on, which provides a smooth closing of the bit stream at the end of a packet. After a short amount of time, the dump path can be turned off by setting the signal CURRENT_ENABLE inactive (e.g., low). Hence, once the signals OUTPUT_ENABLE and CURRENT_ENABLE are disabled, the current flow of 18 milliamps is stopped since transistors Q4, Q5, and Q3 are all off.

Embodiments of the present invention significantly reduce power consumed when compared to the conventional solutions. In addition, FIGS. 2-3 do not use a bias correction amplifier as used in FIG. 1, which thereby reduces power consumption. Embodiments of the present invention can be used for the USB 2.0 standard, and can easily be made compatible with other serial I/O standards.

Embodiments of the present invention can be used in a variety of circuits where differential output drivers may be used, such as in USB integrated circuits or other communication devices or semiconductors or the like, battery powered applications such as mobile computing or for bus-powered USB applications.

It is understood that while the various aspects of the particular embodiment set forth herein has been described in detail, the present invention could be subject to various changes, substitutions, and alterations without departing from the spirit and scope of the invention. The particular voltage and current levels described herein could be changed to different voltage and current levels, depending on the particular application and processing technologies involved. For instance, while current levels of approximately 17-19 milliamps and voltages of 3.3 volts and 700-900 millivolts have been referenced above, it is understood that these values are by way of example only and that embodiments of the invention could be configured to operate with other voltage and current values.

While the methods disclosed herein have been described and shown with reference to particular operations performed in a particular order, it will be understood that these operations may be combined, sub-divided, or re-ordered to form equivalent methods without departing from the teachings of the present invention. Accordingly, unless specifically indicated herein, the order and grouping of the operations is not a limitation of the present invention.

It should be appreciated that reference throughout this specification to "one embodiment" or "an embodiment" or "one example" or "an example" means that a particular feature, structure or characteristic described in connection with the embodiment may be included in at least one embodiment of the present invention. Therefore, it should be appreciated that two or more references to "an embodiment" or "one embodiment" or "an alternative embodiment" or "one example" and "an example" in various portions of this specification are not necessarily all referring to the same embodiment. Furthermore, the particular features, structures or characteristics may be combined as desired in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed inventions require more features than are expressly recited in each claim. Rather, as the following claims reflect, inventive aspects lie in less than all features of a single foregoing disclosed embodiment, and each embodiment described herein may contain more than one inventive feature.

While the invention has been particularly shown and described with reference to embodiments thereof, it will be understood by those skilled in the art that various other changes in the form and details may be made without departing from the spirit and scope of the invention.

What is claimed is:

1. An output driver circuit, comprising:
a translator for converting the single ended data input signal into a pair of signals;
a set of output transistors selectively controlled by said pair of signals;
a current source for providing a substantially constant current to the set of output transistors when the output transistors are active; and
a dump path in parallel with the set of output transistors.

2. The output driver circuit of claim 1, further comprising:
logic for selectively controlling the set of output transistors and the dump path.

3. The output driver circuit of claim 2, wherein the logic includes a current enable signal for controlling current flow and a output enable signal for controlling the set of output transistors, wherein about a time when the current enable signal is active and the output enable signal is not active, the dump path is activated so that current from the current source flows through the dump path.

4. The output driver circuit of claim 2, wherein the logic includes a current enable signal for controlling current flow and a output enable signal for controlling the set of output transistors, wherein about a time when the current enable signal is active and the output enable signal is active, the dump path is deactivated so that current from the current source does not flow through the dump path.

5. The output driver circuit of claim 1, wherein the current source is a cascode current source.

6. The output driver circuit of claim 1, wherein the current source provides approximately 17-19 milliamps of current.

7. The output driver circuit of claim 1, further comprising:
a circuit for pre-charging the pair of signals to a pre-charged voltage between VCC and ground.

8. The output driver circuit of claim 7, wherein the pre-charged voltage is approximately 700-900 millivolts.

9. The output driver circuit of claim 1, further comprising:
a voltage reference circuit providing a substantially constant voltage to the current source.

10. The output driver circuit of claim 1, further comprising:
at least one flip flop connected between the data input and the translator.

11. The output driver circuit of claim 1, further comprising:
at least one flip flop connected between the output enable signal and the dump path.

12. The output driver circuit of claim 1, wherein the dump path includes a p-channel transistor having its gate coupled with a current enable signal and an output enable signal through one or more logic gates, said p-channel transistor having its drain coupled with ground through a resistor.

13. A method for operating a differential output driver, comprising:
biasing a current source so that the current source is able to provide a substantially constant current;
providing a dump path to ground, said dump path being normally open-circuited so that no current flows through the dump path;
providing a set of output transistors in parallel with the dump path, said set of transistors being normally open-circuited so that no current flows through the set of output transistors;
activating the dump path so that current from the current source flows through the dump path;
pre-charging a set of data signals to a voltage level;
deactivating the dump path so that no current flows through the dump path; and
activating the set of output transistors so that current flows through the set of output transistors and data is transmitted by the output transistors.

14. The method of claim 13, wherein the operation of biasing a current source biases the current source to provide approximately 17-19 milliamps.

15. The method of claim 13, wherein the operation of pre-charging places the set of data signals to approximately 700-900 millivolts.

16. An output driver circuit, comprising:
a translator for converting the single ended data input signal into a pair of signals;
a set of output transistors selectively controlled by said pair of signals;
a current source for providing a substantially constant current to the set of output transistors when the output transistors are active; and
a circuit for pre-charging the pair of signals to a pre-charged voltage between VCC and ground.

17. The output driver circuit of claim 16, wherein the pre-charged voltage is approximately 700-900 millivolts.

18. The output driver circuit of claim 16, further comprising: a dump path in parallel with the set of output transistors.

19. The output driver circuit of claim 16, wherein the translator includes two or more transistors configured as a differential amplifier.

20. The output driver circuit of claim 16, wherein the current source is a cascode current source.

* * * * *